United States Patent
Dati et al.

(10) Patent No.: US 7,203,884 B2
(45) Date of Patent: Apr. 10, 2007

(54) SHAPED SPECTRAL CODING AND RECORDING SYSTEMS THEREFOR

(75) Inventors: Angelo Dati, Viareggio (IT); Augusto Rossi, Pavia (IT); Davide Giovenzana, Monza (IT)

(73) Assignee: STMicroeletronics S.R.L., Agrate Brianza (MI) (IT)

( * ) Notice: Subject to any disclaimer, the term of this patent is extended or adjusted under 35 U.S.C. 154(b) by 491 days.

(21) Appl. No.: 10/409,634

(22) Filed: Apr. 7, 2003

(65) Prior Publication Data
US 2003/0217326 A1 Nov. 20, 2003

(30) Foreign Application Priority Data
Apr. 12, 2002 (EP) .................... 02425228

(51) Int. Cl.
*H03M 13/00* (2006.01)
(52) U.S. Cl. ................ 714/752; 714/786
(58) Field of Classification Search ........... 714/746, 714/752, 758, 786, 792; 375/262, 265; 341/59
See application file for complete search history.

(56) References Cited

U.S. PATENT DOCUMENTS

| | | | | |
|---|---|---|---|---|
| 5,280,489 A | * | 1/1994 | Fredrickson et al. | 714/788 |
| 5,537,424 A | * | 7/1996 | Karabed et al. | 714/795 |
| 6,347,390 B1 | * | 2/2002 | Ino | 714/792 |
| 6,385,255 B1 | * | 5/2002 | McLaughlin et al. | 375/263 |

* cited by examiner

*Primary Examiner*—Albert Decady
*Assistant Examiner*—Esaw Abraham
(74) *Attorney, Agent, or Firm*—Hogan & Hartson LLP

(57) ABSTRACT

In the MSN encoded form, the symbols of each block of the present invention define a running digital sum (RDS) value, defined as $RDS([a_0 a_1 \ldots a_{N-1}]) = -\Sigma_i (-1)^{a_i}$, where the symbols $a_i$ belong to the set $\{0, 1\}$ and the sum extends for values of i from 0 to N−1. An encoder is configured to satisfy at least one of the following characteristics: a) blocks of symbols with a given length (L) are used for encoding, wherein $RDS = RDS_0 + 4 \cdot K$, where K is an integer, RDS is the said running digital sum, $RDS_0$ is defined as zero for even values of the said length (L), and one for odd values of said length (L), and b) blocks of symbols with a given length (L) are used for MSN coding and encoding is effected by selecting encoded blocks such that the set of running digital sum (RDS) values is the set with the minimum number of elements that satisfy the required rate value, defined as the ratio between the length of the input blocks and the length of the output blocks. A decoder with a simplified trellis structure is used for decoding (as in decoding a digital signal read from media on which the signal in question has been recorded via a vertical or perpendicular magnetic recording technique, for example).

14 Claims, 3 Drawing Sheets

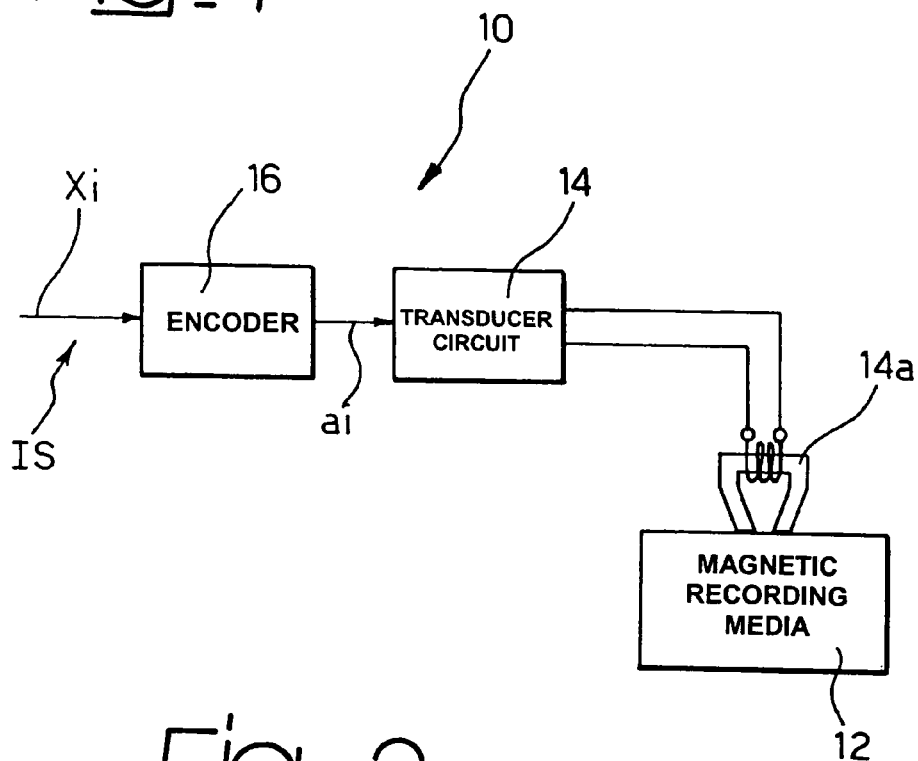
Fig_1
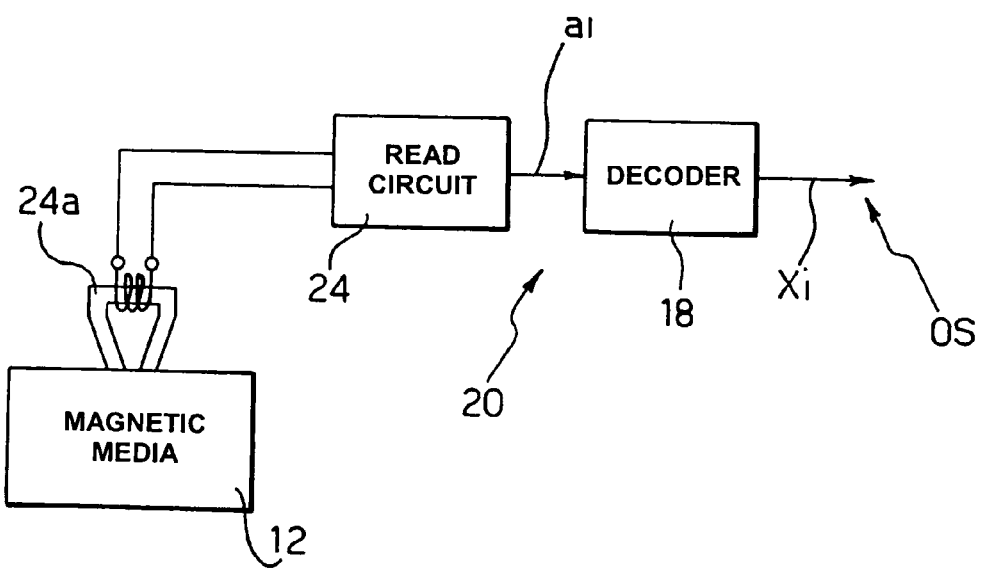
Fig_2

Fig_4
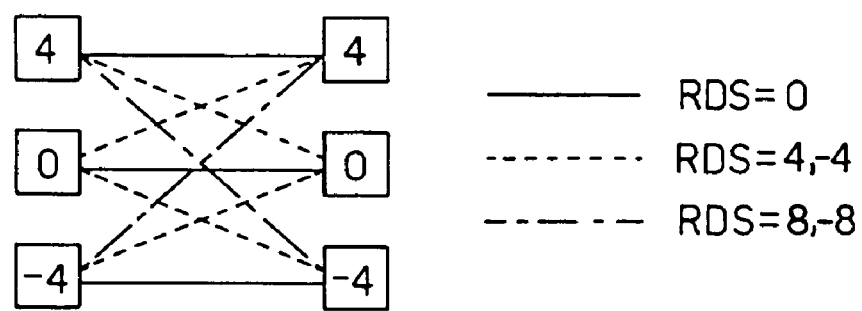
Fig_5
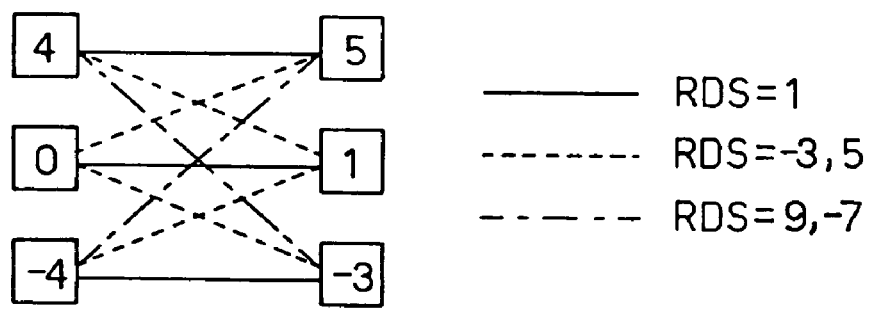

SHAPED SPECTRAL CODING AND RECORDING SYSTEMS THEREFOR

FIELD OF THE INVENTION

The present invention relates to encoding techniques and has been developed with particular attention to possible application in magnetic recording techniques of the "vertical" or "perpendicular" type.

BACKGROUND OF THE INVENTION

The aforesaid recording techniques are considered to be particularly interesting from the viewpoint of achieving improvements in storage density with respect to current storage techniques, substantially based on a "longitudinal" utilization of the recording media.

As opposed to "longitudinal" recording techniques, the waveform read in "vertical" recording systems exhibits a significant energy level even at very low frequencies.

Since, for various reasons, the stages of the read chain are mutually AC-coupled, a certain loss of energy is entailed, which is more noticeable than that occurring in "longitudinal" magnetic recording systems.

To limit this drawback, the AC-coupling frequency is normally kept below 1% of the sampling frequency.

Nevertheless, the system is expected to be capable of tracking constant non-zero levels over an indefinite period of time; this is clearly impossible, since even a low AC-coupling gives rise to an appreciable reaction after more than a hundred samples: this phenomenon is known in the art as the Base Line Wander, or BLW for short.

Dynamic compensation of this phenomenon utilizing a feedback loop has been proposed. The corresponding reaction time is limited, however, due to both the latencies intrinsic in the implementation and the need to realize a decoupling from the control loops, such as those that perform control of the gain, equalisation and sample timing functions.

Shorter term phenomenon, known as "droop", also arises in the same context due to the formation of a polarization charge on the AC-filter after a series of constant non-zero levels. This effect can be successfully compensated by limiting the maximum time between two consecutive signal transitions, a well known technique known as RLL, an acronym for Run Length Limited, encoding.

At the present time, there are known read/write systems for vertical magnetic recording that use a 20/21 RLL encoding for counteracting the droop effect and a combination of feedback and DC-coupling optimisation for minimizing the BLW effect.

SUMMARY OF THE PRESENT INVENTION

The object of the present invention is to provide a further enhanced solution with respect to the previously indicated solutions, especially regarding the possibility of obtaining higher encoding ratios and achieving simpler decoding methods.

According to the invention, this object is achieved thanks to a process having the characteristics specifically referred to in the claims that follow. The invention also regards the corresponding recording systems.

BRIEF DESCRIPTION OF THE DRAWINGS

The invention will now be described, purely by way of a non-limitative example and with reference to the enclosed drawings, wherein:

FIG. 1 illustrates a block diagram of the structure of a signal recording system capable of operating in accordance with the invention, FIG. 2 illustrates a block diagram of the structure of a system for reading magnetic signals capable of operating in accordance with the invention, FIGS. 4 and 5 illustrate certain implementation details of the solution in accordance with the invention.

DETAILED DESCRIPTION

Figure 3:
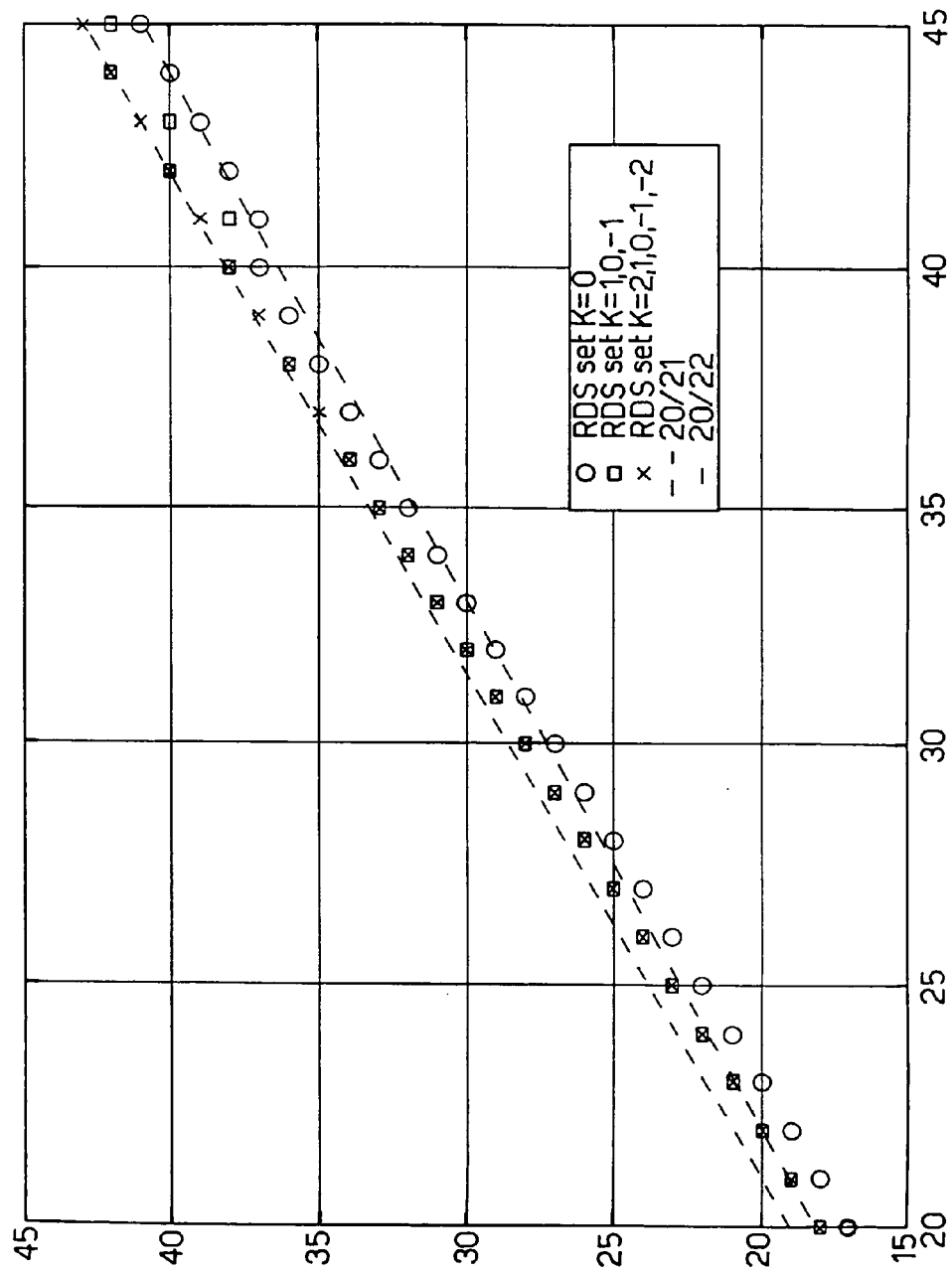
FIG. 3 is a representative diagram of the results that can be achieved by the invention.

FIG. 1 illustrates the general layout of a system, indicated as a whole by reference 10, for recording a digital input signal stream, indicated as IS, onto a known type of magnetic recording media 12 using a vertical magnetic recording technique.

Recording media of this type are well known in the art, as applied to hard disks used in personal computers for example.

This also holds for the transducer circuit, indicated as 14, that, via a magnetic write head indicated as 14a, allows encoded digital signals, the symbols of which are generally indicated as $a_i$, to be written onto the media 12.

The symbols $a_i$ are obtained via the MSN encoding technique, described further on, in the form of code blocks generated by an encoder 16 from a sequence of input symbols, indicated as $x_i$.

In a similar manner, the block diagram in FIG. 2 shows a system, indicated in its entirety as reference 20, possessing the complementary function, or rather that of reading magnetic media 12, via a read circuit 24 with an associated read head 24a (these items are also to be considered as being fully known), based on a vertical or perpendicular magnetic recording technique.

The digital symbols derived from reading the media 12 are indicated as $a_i$. Generally speaking, symbols subjected to MSN-type block encoding, according to the criteria described further on, are being dealt with.

Reference 18, instead, indicates a decoder preferably consisting of a block decoder with a typical trellis structure.

The decoder 18 is intended to decode the symbols $a_i$ in the code blocks used for recording on the media 12, supplying the sequence of symbols $x_i$ as the output signal OS.

The present invention pertains to the class of encoding techniques currently known as Matched Spectral Null, or MSN for short. In effect, this is a shaped spectrum encoding technique that allows the power spectrum of a signal source to be manipulated such that the spectrum of the encoded signal is null in correspondence with certain selected frequencies.

MSN codes are also well known in the magnetic recording field as error correction codes. Reference may be had to: "Matched Spectral Null Codes for Partial Response Channels", R. Karabek, P. Siegel, IEEE Trans. Info. Th., vol. 37, no. 3, pt. II, pgs. 818–855, May 1991 and "Viterbi Detection of Matched Spectral Null Codes for PR4 System", L. J. Fredrickson, IEEE Trans. On Magnetics, vol. 28, no. 5, September 1992.

The solution in accordance with the invention exploits the fact that simple variations of the MSN structure exist that allow the energy level corresponding to the MSN frequencies to be controlled in a precise manner even if complete cancellation is not achieved. At the same time, it is also possible to achieve a slightly less than optimal control of RLL encoding, since for the same RLL length, the MSN coding structure provides lower encoding factors.

Specifically, the solution in accordance with the invention regards a class of MSN codes that control the emission of DC power from the source. DC-control is applied over a relatively short time frame (less than 50 samples), thus also contributing to the control of the Base Line Wander phenomenon, or BLW.

In particular, a code block MSN related to the DC-component is characterized by the Running Digital Sum (RDS), defined as $$RDS([a_0 a_1 \ldots a_{N-1}]) = -\Sigma_i (-1)^{a_i}$$

where the symbols $a_i$ belong to the set $\{0, 1\}$ and the sum extends for values of i from 0 to N−1.

Strictly speaking, application of the DC-constraint (that is null spectrum at frequency 0) requires that the running digital sum RDS reaches zero.

It can be verified however, that higher encoding factors can be achieved by relaxing these constraints, i.e. whereby the RDS result falls within a wider set of values.

The proposed solution, based on the utilization of MSN codes, presents an additional advantage in that it can be exploited to achieve encoding gains with respect to RLL codes.

In the presence of Additive White Gaussian Noise (AWGN), the encoding gain of the MSN codes is equal to 3 dB before rate loss. In the typical noise ambient of magnetic recording, this gain drops to 1 dB, lower than the above indicated value but still appreciable.

To represent the state of the combined partial response channel as well as the state of the MSN source, a class five system (class 5 PRML) and 20/22 MSN coding, a total of 16×22=352 trellis states, are required (the terminology adopted herein is that currently used in the art, in relation to Viterbi decoders for example). This situation exceeds normal implementation capacities at the requested system speeds.

In the described solution, a state space relative to the simplified MSN code is represented, which does not corresponds to the local RDS value, but to the parity of the encoded word. The parity P of the encoded word is unequivocally associated to the RDS of the block, provided the set of permitted RDS values for the blocks is chosen in an adequate manner as follows:

$$RDS([a_0 a_1 \ldots a_{N-1}]) = N_1 - N_0$$

This represents an equivalent definition of RDS, where $N_1$ is the number of "ones" in the encoded block (encoded word) and $N_0$ is the number of "zeroes".

Indicating the length of the encoded word as L, $$L1 = (L+RDS)/2$$

$$P = N \bmod 2 = [(L+RDS)/2] \bmod 2$$

Given an RDS in the set:

$$RDS = RDS_0 + 4K, \quad (1)$$

where K is an integer and $RDS_0$ is defined as zero for even values of L, and one for odd values of L, it can be immediately verified that P is unequivocally defined for a chosen L value.

In this case, the total number of states is equal to 16×2=32, corresponding to the current standard. The detector trellis is exactly the same as that corresponding to the same parity detector normally used utilized for the parity checking currently employed in longitudinal recording techniques (Reed-Solomon or similar, for example).

Using MSN codes that obey the aforesaid definition rule, the codes that can be constructed are represented by the relationship existing between the length of the blocks in input (ordinate scale of the graph in FIG. 3) and the length of the—encoded—blocks at the output (abscissa scale of the graph in FIG. 3).

By allowing multiple values for the block RDS, it is possible to reach a compromise between the DC energy emission from the source and bandwidth utilization. In a system where the MSN code is serially concatenated to an error correction code that works on bit strings, such as a Reed-Solomon type code using 10-bit symbols as used in hard disk applications for instance, it is advantageous to employ input block lengths that are integer multiples of 10.

In FIG. 3, it can be seen that the values 20/22, 30/32 and 40/42 are all possible with a RDS $\{-4, 0, 4\}$, The 40/42 rate reaches the 20/21 rate with a longer block.

It is important to note that, on its own, the limitation on RDS does not unequivocally specify the encoding/decoding table, which has other degrees of freedom, capable of being utilized for improving the RLL constraint.

The construction rule used for FIG. 3, for example, could define a class of 20/22 candidates that from A, the set of $2^{22}$ 22-bit strings $\{0, 1\}$, only selects strings with RDS in the set $\{-4, 0, 4\}$.

This is the property that already defines the code as being included in the class of parity decodable MSNs.

To improve the RLL properties, additional rules are introduced to further define the coding.

All of the following rules improve coding properties from the perspective of vertical recording detection:
  all of the strings in A that do not contain the strings "00000" or "11111",
  all of the strings in A that do not start with "000" or "111",
  all of the strings in A that do not end with "000" or "111".

There are 1141408 strings that simultaneously satisfy all four of the above-defined limitations. There are another 92832 strings that can be subjected to arbitrary rejection (thrashed) to create a 20/22 code, thereby obtaining approximately $10^{139791}$ equivalent 20/22 codes.

The set of rules can be generalised in the following manner: given a block length L, the set of RDS values is chosen as the set with the minimum number of elements that satisfy the required rate value, defined as the ratio between the length of the input blocks and the length of the output blocks. This is in effect the generalisation of the previously illustrated rule.

All of the following rules improve coding properties from the perspective of vertical recording detection:
  remove all strings $(0)^N$ and $(1)^N$, where, for example, $(0)^3$ defines the strings "000" as specified in (1) above. N must be the minimum integer value that still allows code construction, i.e. there must be at least $2^{RL}$ strings that remain after selection,
  remove all strings that commence with $(0)^{floor(N/2)}$ or $(1)^{floor(N/2)}$,
  remove all strings that terminate with $(0)^{ceil(N/2)}$ or $(1)^{ceil(N/2)}$.

As in the 20/22 case, all successive selections made for satisfying the desired size of coding table $2^{RL}$ produce equivalent system performance.

In the case of even coded word lengths—the diagram in FIG. 4 represents the permitted transitions between blocks for satisfying the definition of parity decodable MSN codes.

The initial state and the final state have the same parity.

In the case of odd coded word lengths—the diagram in FIG. 5 represents the permitted transitions between blocks for satisfying the definition of parity decodable MSN codes.

Parity is flipped between the initial state and the final state.

Of course, without prejudice to the principle of the invention, the constructional details and embodiments could be extensively changed with respect to that described and illustrated, without leaving the scope of this invention, as defined by the annexed claims.

We claim:

1. A magnetic recording technique having an improved encoding ratio comprising:
providing an input digital signal;
converting the digital signal between a non-encoded form ($x_i$) and an encoded form ($a_i$) via Matched Spectral Null (MSN) block encoding where, in the encoded form, the signal is arranged in blocks of symbols ($a_i$), the symbols of each block defining a running digital sum (RDS) value, defined as RDS($[a_0 a_1 \ldots a_{N-1}]$)=$-\Sigma_i (-1)^{a_i}$, wherein the symbols $a_i$ belong to the set $\{0, 1\}$ and the sum extends for values of i from 0 to N−1, with blocks of symbols with a given length (L) used for MSN coding, wherein RDS=$RDS_0$+4K, where K is an integer, RDS is the said running digital sum, $RDS_0$ is defined as zero for even values of the said length (L), and one for odd values of said length (L), and wherein the process represents a state space that corresponds to the parity of the encoded signal;
driving a write head with the digital signal in encoded form; and
writing the digital signal in encoded form on magnetic recording media via a magnetic recording technique.

2. The process of claim 1, further including the step of:
rejecting blocks corresponding to strings of symbols ($a_i$) selected from the set comprising:
all strings $(0)^N$ and $(1)^N$, where N is the minimum integer value that still allows code construction, with at least $2^{RL}$ strings that remain after selection;
strings that commence with $(0)^{floor(N/2)}$ or $(1)^{floor(N/2)}$; and
strings that terminate with $(0)^{ceil(N/2)}$ or $(1)^{ceil(N/2)}$.

3. The process of claim 1, further comprising decoding the encoded form of the digital signal with a decoder having a trellis structure configured as a parity checker.

4. The process of claim 1, wherein the step of writing the digital signal in encoded form ($a_i$) on magnetic recording media is via a vertical or perpendicular magnetic recording technique.

5. The process of claim 1, further comprising reading the digital signal in encoded form ($a_i$) from recording media, wherein the encoded signal is recorded with a vertical or perpendicular magnetic recording technique.

6. A magnetic recording technique having an improved encoding ratio comprising:
providing an input digital signal:
converting the digital signal between a non-encoded form ($x_i$) and an encoded form ($a_i$) via Matched Spectral Null (MSN) block encoding where, in the encoded form, the signal is arranged in blocks of symbols ($a_i$), the symbols of each block defining a running digital sum (RDS) value, defined as RDS($[a_0 a_1 \ldots a_{N-1}]$)=$-\Sigma_i (-1)^{a_i}$, wherein the symbols $a_i$ belong to the set $\{0, 1\}$ and the sum extends for values of i from 0 to N−1, wherein blocks of symbols with a given length (L) are used for MSN coding and encoding by selecting blocks such that the set of running digital sum (RDS) values is the set with the minimum number of elements that satisfy the required rate value, defined as the ratio between the length of the input blocks and the length of the output blocks, and wherein the process represents a state space that corresponds to the parity of the encoded signal
driving a write head with the digital signal in encoded form; and
writing the digital signal in encoded form on magnetic recording media via a magnetic recording technique.

7. The process of claim 6, further including the step of:
rejecting blocks corresponding to strings of symbols ($a_i$) selected from the set comprising:
all strings $(0)^N$ and $(1)^N$, where N is the minimum integer value that still allows code construction, with at least $2^{RL}$ strings that remain after selection;
strings that commence with $(0)^{floor(N/2)}$ or $(1)^{floor(N/2)}$; and
strings that terminate with $(0)^{ceil(N/2)}$ or $(1)^{ceil(N/2)}$.

8. The process of claim 6, further comprising decoding the encoded form of the digital signal with a decoder having a trellis structure configured as a parity checker.

9. The process of claim 6, wherein the step of writing the digital signal in encoded form ($a_i$) on magnetic recording media is via a vertical or perpendicular magnetic recording technique.

10. The process of claim 6, further comprising reading the digital signal in encoded form ($a_i$) from recording media, wherein the encoded signal is recorded with a vertical or perpendicular magnetic recording technique.

11. A system for recording digital signals on recording media with a magnetic recording technique having an improved encoding ratio comprising:
an encoder for converting the digital signal into an encoded form via Matched Spectral Null (MSN) block encoding wherein, in the said encoded MSN form, the signal is arranged in blocks of symbols ($a_i$), the symbols of each block defining a running digital sum (RDS) value, defined as RDS($[a_0 a_1 \ldots a_{N-1}]$)=$-\Sigma_i (-1)^{a_i}$, wherein the symbols $a_i$ belong to the set $\{0, 1\}$ and the sum extends for values of i from 0 to N−1, and wherein blocks of symbols with a given length (L) are used for encoding, wherein RDS=$RDS_0$+4K, where K is an integer, RDS is the said running digital sum, and $RDS_0$ is defined as zero for even values of the said length (L), and one for odd values of said length (L), and wherein the encoding represents a state space that corresponds to the parity of the encoded signal;
a transducer having an input coupled to an output of the encoder; and
a write head coupled to the encoder for writing the digital signal in encoded form on magnetic recording media via a magnetic recording technique.

12. The system of claim 11, wherein the magnetic recording technique is a vertical or perpendicular magnetic recording technique.

13. A system for recording digital signals on recording media with a magnetic recording technique having an improved encoding ratio comprising:
an encoder for converting the digital signal into an encoded form via Matched Spectral Null (MSN) block encoding wherein, in the said encoded MSN form, the signal is arranged in blocks of symbols ($a_i$), the symbols of each block defining a running digital sum (RDS) value, defined as $RDS([a_0 a_1 \ldots a_{N-1}]) = -\Sigma_i (-1)^{a_i}$ wherein the symbols $a_i$ belong to the set $\{0, 1\}$ and the sum extends for values of i from 0 to N−1, and wherein blocks of symbols with a given length (L) are used for MSN coding and encoding by selecting encoded blocks such that the set of running digital sum (RDS) values is the set with the minimum number of elements that satisfy the required rate value, defined as the ratio between the length of the input blocks and the length of the output blocks, and wherein the encoding represents a state space that corresponds to the parity of the encoded signal;

a transducer having an input coupled to an output of the encoder; and a write head coupled to the encoder for writing the digital signal in encoded form on magnetic recording media via a magnetic recording technique.

14. The system of claim 13, wherein the magnetic recording technique is a vertical or perpendicular magnetic recording technique.

* * * * *